(12) United States Patent
Lahnor et al.

(10) Patent No.: US 6,821,894 B2
(45) Date of Patent: Nov. 23, 2004

(54) CMP PROCESS

(75) Inventors: Peter Lahnor, Dresden (DE); Stephan Wege, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/933,304

(22) Filed: Aug. 20, 2001

(65) Prior Publication Data

US 2002/0036181 A1 Mar. 28, 2002

(30) Foreign Application Priority Data

Aug. 31, 2000 (DE) .......................... 100 42 932

(51) Int. Cl.$^7$ ............................. H01L 21/302

(52) U.S. Cl. ...................... 438/691; 438/692; 438/693; 216/17

(58) Field of Search ................... 438/691, 692, 438/693; 216/17, 18; 451/57, 63

(56) References Cited

U.S. PATENT DOCUMENTS

| | | | |
|---|---|---|---|
| 5,534,462 A | | 7/1996 | Fiordalice et al. |
| 5,726,094 A | * | 3/1998 | Schwalke et al. ............ 438/561 |
| 6,025,273 A | * | 2/2000 | Chen et al. ................. 438/706 |
| 6,261,158 B1 | * | 7/2001 | Holland et al. ............... 451/63 |
| 6,274,499 B1 | * | 8/2001 | Gupta et al. ................ 438/692 |
| 6,331,479 B1 | * | 12/2001 | Li et al. ..................... 438/618 |
| 6,455,430 B2 | * | 9/2002 | Abe .......................... 438/691 |

FOREIGN PATENT DOCUMENTS

| | | |
|---|---|---|
| EP | 0 696 819 A1 | 2/1996 |
| WO | WO 99/33102 | 7/1999 |

* cited by examiner

Primary Examiner—Lan Vinh
(74) Attorney, Agent, or Firm—Welsh & Katz, Ltd.

(57) ABSTRACT

The optimization of a CMP process provides the use of an auxiliary layer (4) between a dielectric (1) in the vicinity of patterned portions and a layer of a liner (2). If the liner (2) is perforated in the CMP process, then the undercutting of the liner (2) by the chemical removal of the auxiliary layer (4) simplifies the process overall. Advantages are significantly lower defect densities due to CMP scratches, fewer short circuits, fewer alignment errors.

7 Claims, 2 Drawing Sheets

CMP PROCESS

Figure 1:
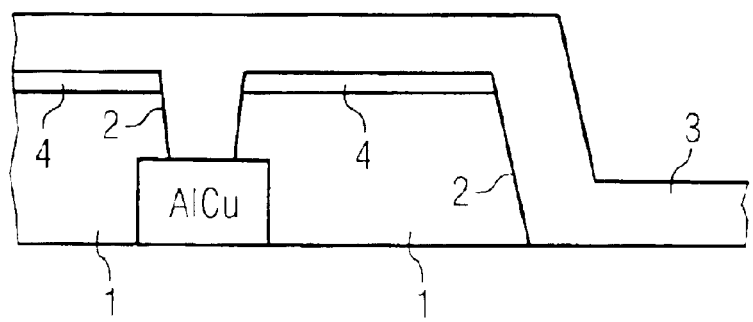

The invention relates to a metal CMP process in conjunction with the contact hole or metal track etching. The metalization layers used in this case may be composed for example of tungsten or copper.

In electronic components, connections between metal track planes generally comprise so-called W or tungsten contacts. The latter are produced as follows: after the patterning of the contact holes, a liner generally composed of titanium and titanium compounds (e.g. TiN) is applied over the whole area and a metalization layer made of tungsten is subsequently applied to the dielectric. Afterward, the applied material is removed in regions in a CMP process (chemical mechanical polishing process). This CMP step stops on the dielectric in which the patterned portions are present. The tungsten-filled contact holes remain. The same is similarly true for a copper metalization layer or other metalization layer in which both the contact holes and the interconnect are patterned before the metal deposition into the dielectric.

The procedure according to the prior art is associated with various problems:

A high defect density results due to CMP scratches, said density depending on how long the dielectric is polished.

The alignment markers of the lithography are significantly eroded, which can lead to overlay errors.

As a result of excessively short polishing in the CMP process, metal residues in the following metal plane can lead to short circuits.

Defects in underlying planes (e.g. scratches, holes) are mapped in the dielectric and are filled with metal. This metal can only be removed with difficulty in the CMP step and later leads to short circuits.

The disadvantages listed are aggravated by the fact that the end point identification of the CMP process is unreliable. If the dielectric has a residual topology, then this results in further disadvantages since a longer polishing time becomes necessary.

Methods of this type can also be applied to an interconnect plane, the so-called damascene technique being used. In this document, the technical subject matter is essentially described with reference to contact holes.

The invention is based on the object of providing an improved CMP process.

The invention is based on the insight that the CMP process can be significantly improved by means of a suitable auxiliary layer which is applied to the dielectric before the contact hole or metal track etching. The auxiliary layer, which can be etched wet-chemically without any residues due to the oxidizing conditions during the metal CMP process or can be removed to a great extent by the polishing, reduces excessive processing of the surface of the dielectric.

The auxiliary layer is preferably formed with a thickness of 20 to 100 nm. It is preferably composed of diamond-like carbon, carbon polymers or of other porous materials. What is crucial is the easy and residue-free removal in the CMP process. The oxidizing conditions in a metal CMP process are produced, for example, by the following substances: $Fe(NO_3)_3$, $H_2O_2$, $KIO_4$.

The possibility of undercutting the liner as soon as the latter is perforated in the CMP process means that the liner itself can be polished away significantly more quickly in the surroundings. Overall, this leads to the following advantages:

The liner is removed more reliably and more quickly, which shortens the time for the CMP process. As a direct consequence of this, the time of overpolishing on the dielectric is reduced, as a result of which the defect density directly decreases. Another advantage that should be mentioned in this connection is that the edge rounding of alignment markers is greatly reduced, thereby enabling more reliable and more accurate alignment of the photomask for patterning the next metal plane.

In the case of an existing topology in or on the dielectric, the risk of liner residues in deeper regions can be considerably reduced. This is based on the elevation of the liner and of the metalization layer by the underlying auxiliary layer. Consequently, the liner and the metalization layer can be encompassed by the CMP process in particular in superficial depressions of the dielectric.

If local topologies are transferred through defects from deeper planes, then they are filled with the auxiliary layer instead of with metal.

This can prevent metal residues, which would later lead to short circuits, from remaining at these locations.

Furthermore, the patternability of the next metal planes can be positively influenced in that the height by which an interconnect or the contact hole projects beyond the dielectric is reduced. This is to be seen in connection with a lower defect density after the metal CMP process, and, in the subsequent so-called touchup, the quantity of oxide to be removed is reduced.

Preferably, an additional wet-chemical cleaning step can be added if residues of the auxiliary layer have to be removed. This cleaning step can be combined in a simple manner with the obligatory brush cleaning after the CMP process or the wet-chemical postcleaning.

An advantageous refinement of the invention provides for the auxiliary layer to be used as a hard mask for the contact hole patterning by means of dry etching. This is done before the CMP process, resulting in multiple utilization of the auxiliary layer. In conjunction with a CARL resist, such an auxiliary layer can equally be used as a replacement for a bottom resist as a hard mask for the patterning of contact holes. Consequently, there is no cost disadvantage due to an additional layer.

An exemplary embodiment is described below with reference to diagrammatic figures.

Figure 2:
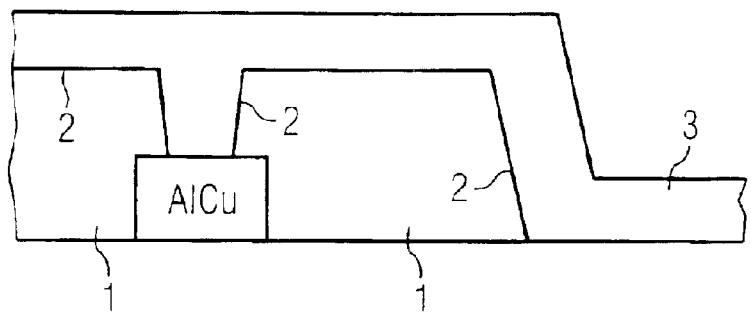
Figure 3:
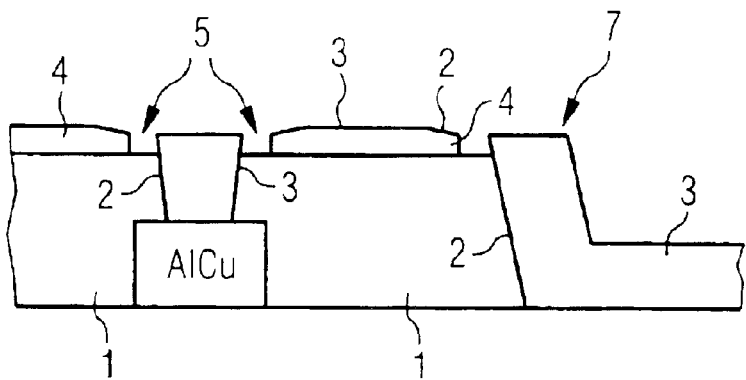
Figure 4:
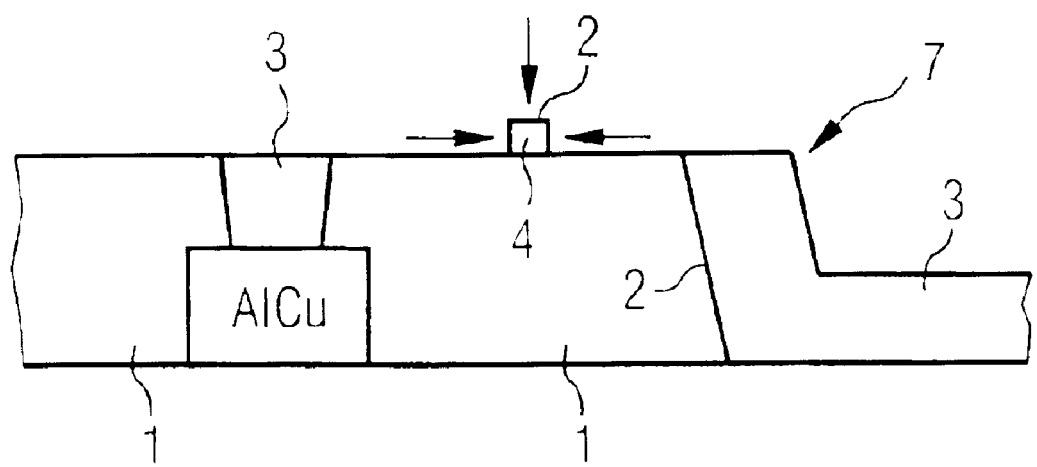
Figure 5:
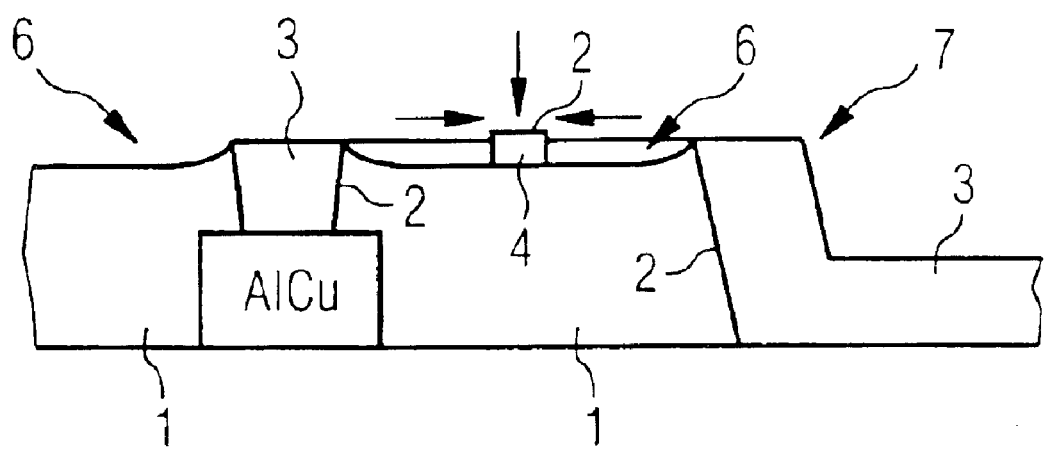

FIG. 1 shows the cross section before a tungsten CMP process with an auxiliary layer 4, FIG. 2 shows the prior art without an auxiliary layer 4, FIG. 3 shows the reaching of the auxiliary layer 4, which the CMP process formally perforates on account of the rapid removal of the auxiliary layer, FIG. 4 shows the removal of liner residues by a combination of polishing and undercutting, and FIG. 5 shows the removal of liner residues with bottom topology.

The auxiliary layer can also be referred to as a perforation layer since the CMP process is perforated insofar as the metalization layer and the liner are simpler to remove due to the use of the auxiliary layer. The auxiliary layer itself is completely removed in the process. Since the auxiliary layer is initially completely covered by the liner and by the metal, the etching attack can only take place locally where the CMP process has completely removed the liner. The liner is subsequently uncut at these locations in accordance with FIG. 3.

FIGS. 1 and 3 to 5 show the diagrammatic sequence of contact hole etching for the production of so-called W contacts. Each illustration shows a dielectric 1 which is generally composed of an oxide and in which a contact hole is intended to be produced. By means of previous patterning, a cavity has been produced above a region made of aluminum-copper contained in the dielectric 1, which cavity is completely lined by the liner 2 and is filled with tungsten 3. According to the prior art, the liner 2 lying above the region of the dielectric and also the overlying metalization layer made of tungsten 3 would be removed in a CMP process. In order to remove the liner 2 without residues, said liner generally being composed of a relatively hard material such as titanium, for example, a high degree of overpolishing has to be effected. This leads to a significant defect density due to CMP scratches on the dielectric.

FIG. 1 shows an illustration in accordance with the prior art in FIG. 2, the auxiliary layer 4 additionally being present. The auxiliary layer 4 is positioned on the dielectric 1. The auxiliary layer 4 is not present in patterned portions such as through holes. FIG. 1 reveals that, in a CMP process which is stopped on the dielectric 1, both the tungsten layer 3 and the liner 2 are partially removed and the auxiliary layer 4 is completely removed. The property of the auxiliary layer 4 leads to the CMP process being substantially optimized in that, when the liner 2 is perforated, the latter is undercut and is relatively simple to remove.

FIG. 3 diagrammatically shows the reaching of the auxiliary layer 4 in the CMP process, the layer of the liner 2 having perforations 5, so that the auxiliary layer 4 can be chemically removed or undercut.

FIG. 4 illustrates the rapid removal of liner residues by the combination of chemical and mechanical removal. The arrows illustrated indicate that the auxiliary layer 4 is both removed laterally by undercutting and the mechanical polishing process acts from above.

FIG. 5 shows a topology comprising depressions on the surface of the dielectric 1. In the prior art, this bottom topology would ensure that the process time is greatly prolonged until the liner 2 is removed without residues. The presence of the auxiliary layer 4 means that the liner layer is elevated above the surface of the dielectric 1 in such a way that fast mechanical removal is possible. The chemical etching of the auxiliary layer 4 acts at the same time.

It is possible to detect the reaching of the auxiliary layer by an end point signal during the CMP process. It is now possible to use, in particular, motor current measurements, temperature measurements, optical reflection measurements, acoustic and vibration measurements or even measurements of pad discoloration.

For the case where the auxiliary layer 4 is simultaneously used as a hard mask for preceding patterning processes, it can be used as part of a CARL method. The process control in the case of a CARL resist takes place in three steps.

In the first step, the CARL resist is applied, exposed, developed and silylated. In the second step, the auxiliary layer is etched through selectively with respect to the silylated CARL layer. This is done using $O_2$ with $SO_2$, $CHF_3$, $N_2$ or $H_2/N_2$ in a dry etching method. Preferably, it is possible to use MERIE reactors (magnetically enhanced reactive ion etching) or high density sources, such as inductively coupled excitations, or an ECR source.

The actual via (contact hole) is patterned with high selectivity with respect to the auxiliary layer 4 in a second step. This is done using Ar, $CHF_3$, $CF_4$ or Ar, $C_4F_8$, CO, $O_2$ or Ar, $C_5F_8$, $O_2$ or Ar, $C_4F_6$, $O_2$. The CARL resist is simultaneously removed in the process. In this way, the dimensional accuracy of the vias can be improved, and the risk of an etching stop in the case of excessively small or excessively deep vias is reduced.

By way of example, the upper corners or edges of the layer made of tungsten 3 are used as alignment markers 7, as is illustrated in FIGS. 3 to 5. According to the prior art, in the case of a customary polishing time, these edges are in some instances greatly eroded, i.e. rounded, with the result that alignment errors arise. As a result of the reduction of the CMP process time, these alignment markers 7 are attacked to a lesser extent, i.e. are formed with higher contrast.

List of reference symbols

1. Dielectric
2. Liner
3. Tungsten
4. Auxiliary layer
5. Perforation
6. Topology
7. Alignment marker

What is claimed is:

1. A method for producing a metal contact in a dielectric comprising the steps of forming a contact via in said dielectric;

providing a liner made of titanium or a titanium compound on the whole area of said dielectric and in said contact via;

providing a metalization on said whole area, on said dielectric and in said contact via, wherein at least in the surroundings of said contact via providing an auxiliary layer on said dielectric between said dielectric and said liner, perforating said liner and said auxiliary layer to form a plurality of perforations; undercutting said liner by etching said liner through said perforation, and removing said metalization on said liner and said auxiliary layer by a Chemical Mechanical Polishing process, said process stopping on said dielectric, whereby upon perforation of said liner and said auxiliary layer an under etch of said liner by removal of said auxiliary layer is effected such that the liner lying thereon is lifted off.

2. The method as claimed in claim 1, wherein the auxiliary layer has a layer thickness in the range of 20 to 100 am.

3. The method as claimed in claim 1, wherein the auxiliary layer is used at least partly as a hard mask for the patterning and preceding the etching by dry etching.

4. The method as claimed in claim 1, wherein the auxiliary layer is detected by an etching stop detection signal during the CMP process.

5. The method as claimed in claim 1, wherein an additional wet-chemical cleaning step is carried out at the end of the etching.

6. The method as claimed in claim 1, wherein the auxiliary layer is composed of diamond-like carbon, carbon polymers or of porous material.

7. The CMP process as claimed in claim 6, wherein the auxiliary layer is used in conjunction with a CARL resist as bottom resist.

* * * * *